United States Patent
Jan et al.

(10) Patent No.: US 9,082,960 B2
(45) Date of Patent: Jul. 14, 2015

(54) FULLY COMPENSATED SYNTHETIC ANTIFERROMAGNET FOR SPINTRONICS APPLICATIONS

(71) Applicant: Headway Technologies, Inc., Milpitas, CA (US)

(72) Inventors: Guenole Jan, San Jose, CA (US); Ru-Ying Tong, Los Gatos, CA (US)

(73) Assignee: Headway Technologies, Inc., Milpitas, CA (US)

( * ) Notice: Subject to any disclaimer, the term of this patent is extended or adjusted under 35 U.S.C. 154(b) by 54 days.

(21) Appl. No.: 13/863,542

(22) Filed: Apr. 16, 2013

(65) Prior Publication Data
US 2014/0306302 A1   Oct. 16, 2014

(51) Int. Cl.
| | |
|---|---|
| H01L 43/10 | (2006.01) |
| H01L 43/02 | (2006.01) |
| H01L 43/12 | (2006.01) |
| H01F 10/30 | (2006.01) |
| H01F 10/32 | (2006.01) |
| H01L 43/08 | (2006.01) |

(52) U.S. Cl.
CPC .............. *H01L 43/10* (2013.01); *H01F 10/30* (2013.01); *H01F 10/32* (2013.01); *H01L 43/02* (2013.01); *H01L 43/08* (2013.01); *H01L 43/12* (2013.01)

(58) Field of Classification Search
CPC ..................................................... H01L 43/10
USPC ............................ 257/9, 421; 365/158; 438/3
See application file for complete search history.

(56) References Cited

U.S. PATENT DOCUMENTS

| | | | |
|---|---|---|---|
| 6,381,107 B1 | 4/2002 | Redon et al. | |
| 7,443,636 B2 | 10/2008 | Hoshino et al. | |
| 8,736,004 B2* | 5/2014 | Cao et al. | 257/421 |
| 8,786,039 B2* | 7/2014 | Apalkov et al. | 257/421 |
| 2004/0013880 A1 | 1/2004 | Daughton et al. | |
| 2009/0213503 A1 | 8/2009 | Sun et al. | |
| 2009/0213638 A1 | 8/2009 | Morise et al. | |
| 2012/0012953 A1 | 1/2012 | Lottis et al. | |
| 2012/0299134 A1 | 11/2012 | Jan et al. | |

OTHER PUBLICATIONS

"Current-driven excitation of magnetic multilayers," by J.C. Slonczewski, Journal of Magnetism and Magnetic Materials 159, L1-L7, Jun. 1996, Elsevier.
PCT Search Report PCT/US2014/033912, Jul. 25, 2014, Headway Technologies, Inc.

(Continued)

*Primary Examiner* — Mark Prenty
(74) *Attorney, Agent, or Firm* — Saile Ackerman LLC; Stephen B. Ackerman

(57) ABSTRACT

A synthetic antiferromagnet serving as a reference layer for a magnetic tunnel junction is a laminate with a plurality of "x+1" magnetic sub-layers and "x" non-magnetic spacers arranged in an alternating fashion, with a magnetic sub-layer at the top and bottom of the laminated stack. Each spacer has a top and bottom surfaces that interface with adjoining magnetic sub-layers generating antiferromagnetic coupling between the adjoining sub-layers. Perpendicular magnetic anisotropy is induced in each magnetic sub-layer through an interface with a spacer. Thus the dipole field exerted on a free layer is substantially reduced compared with that produced by a conventional synthetic antiferromagnetic reference layer. Magnetic sub-layers are preferably Co while Ru, Rh, or Ir may serve as non-magnetic spacers.

25 Claims, 4 Drawing Sheets

(56) References Cited

OTHER PUBLICATIONS

"Magnetic and Transport Behavior of AF-Coupled Layers With a Limited Number of Repetitions," by M.M.H. Willekens, et al., Materials Research Society Symposium Proceedings, vol. 313, Jan. 1993, pp. 129-134, XP055127337.

"A New Phase Diagram for Layered Antiferromagnetic Films," by Olav Hellwig, et al., Nature Materials, vol. 2, No. 2, Jan. 12, 2003, pp. 112-116, XP055128415.

* cited by examiner

FULLY COMPENSATED SYNTHETIC ANTIFERROMAGNET FOR SPINTRONICS APPLICATIONS

RELATED PATENT APPLICATION

This application is related to Ser. No. 13/609,780, filing date Sep. 11, 2012; assigned to a common assignee as the current disclosure and which is herein incorporated by reference in its entirety.

TECHNICAL FIELD

The present disclosure relates to a magnetic tunnel junction (MTJ) in which a laminated reference layer has perpendicular magnetic anisotropy (PMA) and exerts a reduced dipole field (Ho) on a free layer because of spacers formed between magnetic sub-layers in the reference layer wherein each spacer establishes antiferromagnetic coupling between adjoining magnetic sub-layers, and induces PMA at interfaces with the magnetic sub-layers.

BACKGROUND

Magnetoresistive Random Access Memory (MRAM), based on the integration of silicon CMOS with MTJ technology, is a major emerging technology that is highly competitive with existing semiconductor memories such as SRAM, DRAM, and Flash. Spin-transfer torque (STT) magnetization switching described by C. Slonczewski in "Current driven excitation of magnetic multilayers", J. Magn. Magn. Mater. V 159, L1-L7 (1996), has stimulated considerable interest due to its potential application for spintronic devices such as STT-MRAM on a gigabit scale.

STT-MRAM has a MTJ element that is usually based on a tunneling magneto-resistance (TMR) effect wherein a stack of layers has a configuration in which two ferromagnetic layers are separated by a thin non-magnetic dielectric layer. The MTJ element is typically formed between a bottom electrode such as a first conductive line and a top electrode which is a second conductive line at locations where the top electrode crosses over the bottom electrode. A MTJ stack of layers may have a bottom spin valve configuration in which a seed layer, reference layer, a thin tunnel barrier layer, a ferromagnetic "free" layer, and a capping layer are sequentially formed on a bottom electrode. The reference layer has a fixed magnetization direction. The free layer has a magnetic moment that is either parallel or anti-parallel to the magnetic moment in the reference layer. The tunnel barrier layer is thin enough that a current through it can be established by quantum mechanical tunneling of conduction electrons. When a sense current is passed from the top electrode to the bottom electrode in a direction perpendicular to the MTJ layers, a lower resistance is detected when the magnetization directions of the free and reference layers are in a parallel state ("0" or P memory state) and a higher resistance is noted when they are in an anti-parallel state ("1" or AP memory state). In STT-MRAM, the resistance can be switched between the two states by the application of a current pulse of sufficient magnitude to write the bit to the opposite state.

Compared with conventional MRAM, spin-transfer torque or STT-MRAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a current perpendicular-to-plane (CPP) configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. STT-MRAM has the same read mechanism as MRAM but differs in the write operation mechanism.

Typically, the magnetic moments of the reference layer and free layer are in an in-plane direction. However, for a variety of reasons, it is advantageous to engineer perpendicular magnetic anisotropy (PMA) into the aforementioned layers so that their magnetization direction is perpendicular-to-plane. The source of PMA may be intrinsic or it may be induced in a ferromagnetic layer at interfaces with an oxide layer, for example, in situations where the ferromagnetic layer has a thickness less than a threshold level. Spintronic devices with perpendicular magnetic anisotropy have an advantage over MRAM devices based on in-plane anisotropy in that they can satisfy the thermal stability requirement but also have no limit of cell aspect ratio. As a result, spin valve structures based on PMA are capable of scaling for higher packing density which is one of the key challenges for future MRAM applications and other spintronic devices.

In a MTJ within a MRAM or STT-MRAM, a reference layer will typically exert a stray magnetic field upon the free layer that tends to favor either the P or AP state. The stray field (Ho) has a form similar to a non-uniform electric "fringing" field at the edges of a parallel plate capacitor. As depicted in FIG. 1, the stray field Ho 4 from reference layer 1 impinges on the free layer 3. Note that a dielectric spacer 2 such as a tunnel barrier layer separates the free layer and reference layer. When the reference layer 1 is a composite, the net stray field 4 will be the sum of fringing fields from several similar layers in the reference layer stack with the possible addition of a uniform effective "interlayer" coupling field. The free layer is subject to random thermal agitation and the stray field Ho will create a disparity in the thermal stability of the two states, with either the P or AP state rendered more thermally stable. This asymmetry is undesirable since for a given free layer coercivity (Hc), Ho should be zero for optimum stability.

Referring to FIG. 2, a synthetic antiferromagnetic (SAF) structure 18 is commonly employed as a reference layer to reduce the magnitude of Ho that impinges on a free layer 17. The SAF stack consists of two ferromagnetic layers labeled AP2 11, and AP1 13 which are coupled antiferromagnetically through an intervening non-magnetic layer 12 that is typically Ru. There is a tunnel barrier layer 16 formed between the SAF structure 18 and free layer 17. The net stray magnetic field Ho exerted by SAF structure 18 in a STT-MRAM bit with a 40 nm diameter is usually more than 500 Oe which is an unacceptably high value of about the same magnitude as the free layer Hc. Therefore, an improved reference layer is needed that generates a substantially smaller Ho than in current MTJ elements but has high thermal stability to at least 400° C., and maintains other magnetic properties such as a high magnetoresistance (MR) ratio.

SUMMARY

One objective of the present disclosure is to provide a laminated reference layer for a STT-MRAM and other spintronic devices which has PMA, and a Ho field that is <100 Oe and substantially reduced compared with a Ho field produced by a conventional SAF reference layer based on an AP2/Ru/AP1 configuration.

A second objective of the present disclosure is to provide a laminated reference layer according to the first objective where the laminated reference layer also exhibits thermal stability to at least 400° C. and enables desirable magnetic properties including a high MR ratio, and a low resistance× area (RA) value.

According to one embodiment, these objectives are achieved in a MTJ having a bottom spin valve configuration for spintronic device applications such as a read/write head, or spin-transfer oscillator devices for MRAM, or microwave assisted memory recording (MAMR). The MTJ is comprised of a stack of layers including a composite seed layer, a laminated reference layer with magnetic sub-layers separated by non-magnetic spacers, a tunnel barrier layer, free layer, and capping layer which are sequentially formed on a substrate. The seed layer may be TaN/Mg/NiCr, for example, and is critical for enhancing the (111) texture and PMA character in overlying layers. According to one embodiment, the laminated reference layer has a $(Co/Ru)_x/Co$, $(Co/Rh)_x/Co$, or $(Co/Ir)_x/Co$ configuration where the number of laminates "x" is between 1 and 15. Optionally, V, Mo, or Os may be used in place of Ru. The present disclosure also anticipates that one or more Co layers in the laminated reference layer may be replaced by a Co rich CoFe alloy or by a CoM layer where M is one of Ta, Ti, Mg, W, Ru, Rh, Hf, Zr, B, or Nb with a M content less than 5 atomic %. For example, $(Co/Ru)_x/CoFe$ and $(Co/Ru)_x/Co$ are examples of a preferred reference layer configuration. Each of the Co, CoFe, or CoM layers preferably has a thickness from 4 to 15 Angstroms to enable sufficient PMA for spintronic applications. As the thickness of the magnetic sub-layers decreases, antiferromagnetic coupling between adjacent magnetic sub-layers increases. The thickness of the non-magnetic spacer is dependent on the element selected. Each Ru layer thickness is preferably 4, 9, or 14 Angstroms to establish antiferromagnetic coupling between neighboring Co layers. In the case of a Rh layer, a 1.5 or 3 Angstrom thickness is employed to achieve optimum antiferromagnetic coupling. Thus, the dipolar field generated by each magnetic sub-layer is essentially cancelled by an adjacent sub-layer. High coercivity (Hc) is realized when the magnetic sub-layer moments are of similar magnetization.

In an alternative embodiment, a thin Ta dusting layer and a transition layer such as CoFeB or CoFeB/Co may be inserted between the laminated reference layer and tunnel barrier layer. The dusting layer contacts a top layer in the laminated reference layer and the transition layer contacts the tunnel barrier layer and thereby promotes a (100) lattice structure in a MgO tunnel barrier, for example, to enhance the MR ratio.

In another embodiment, a top spin valve structure is provided wherein the positions of the laminated reference layer and free layer in the first embodiment are switched. In all embodiments, the free layer may be a single layer or composite wherein each layer is comprised of one or more of Co, Fe, and Ni. Furthermore, there may be a non-magnetic element such as B in the aforementioned single layer or composite free layer configuration. In another embodiment, the free layer may have a synthetic antiferromagnetic structure such as CoFeB/Ru/CoFe. The present disclosure also encompasses an embodiment wherein the free layer has a laminated structure comprised of a plurality of Co layers and antiferromagnetic (AF) coupling spacer layers formed in an alternating fashion similar to that of the reference layer configuration.

In all embodiments, once all of the layers in the MTJ stack are laid down, a patterning and etching sequence is followed to fabricate a spin valve structure that may be in the shape of an oval, circle, or polygon from a top-down view.

DETAILED DESCRIPTION

Figure 1:
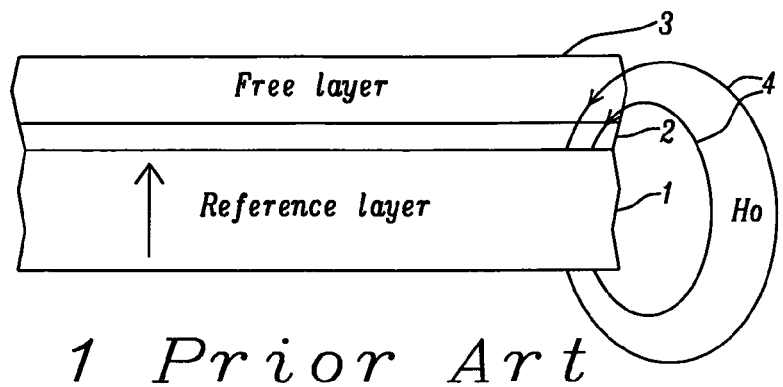
FIG. 1 is a cross-sectional view of a MTJ wherein the stray fringe field Ho from the reference layer is exerted on a free layer.
Figure 2:
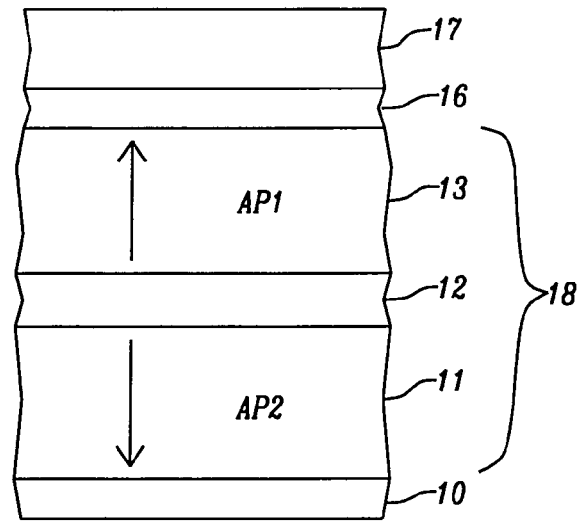
FIG. 2 is a cross-sectional view of a MTJ with a bottom spin valve configuration wherein a reference layer has a SAF structure represented by AP2/coupling layer/AP1.

The present disclosure relates to magnetic memory devices and particularly to those wherein a MTJ structure has a critical dimension that is less than 100 nm to enable a high packing density per square inch during the fabrication process. We have discovered that the insertion of non-magnetic spacers between magnetic sub-layers in a laminated reference stack reduces the dipole field on the free layer and thereby enhances thermal stability of the memory device while maintaining important magnetic properties including magnetoresistive (MR) ratio and resistance×area (RA) value. Although only bottom spin valve or top spin valve configurations are shown in the drawings, the present disclosure also encompasses dual spin valve designs as appreciated by those skilled in the art.

Ideally, one would like to have a magnetic reference layer wherein magnetic moments are anti-parallel at the microscopic level in order to minimize the Ho field exerted on the free layer in a MTJ element. Although, this condition can be achieved in rare earth compensated anti-ferromagnets such as Co/Gd or CoFeTb, these layers have low resistance to corrosion and poor thermal stability that render them unsuitable for magnetic memory applications.

In related application Ser. No. 13/609,780, we disclosed how a synthetic antiferromagnetic (SAF) reference layer with an AP2/Ru/AP1 configuration in which at least one of the AP2 or AP1 layers has a laminated structure such as $(Co/Ni)_n$ is used to reduce the stray (Ho) field on the free layer in a MTJ element. Each of the sub-layers in the laminated reference stack has perpendicular magnetic anisotropy (PMA) wherein all sub-layers are ferromagnetically coupled with all magnetic moments aligned in the same perpendicular to plane direction. Herein we describe another laminated reference layer structure that includes a plurality of magnetic sub-layers that are preferably Co. However, rather than separating the Co layers with a second magnetic element or alloy, a non-magnetic spacer is employed such that "x+1" Co sub-layers are separated by "x" non-magnetic spacers in an alternating fashion. The non-magnetic spacers are relied upon to induce PMA at interfaces with the magnetic sub-layers and to generate antiferromagnetic coupling between adjacent magnetic sub-layers thereby reducing the stray Ho field on the free layer.

Figure 3:
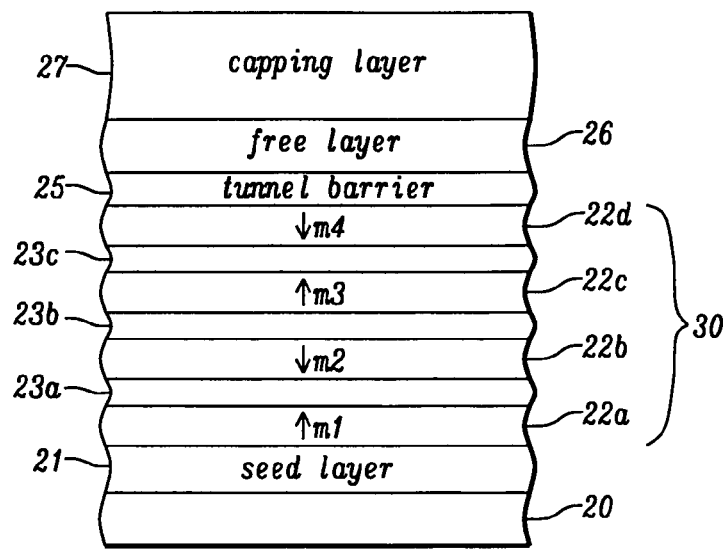
FIG. 3 is cross-sectional view of a MTJ with a bottom spin valve configuration wherein the laminated reference layer has magnetic sub-layers separated by non-magnetic spacers according to a first embodiment of the present disclosure.

Referring to FIG. 3, a first embodiment of the present disclosure features a MTJ having a bottom spin valve configuration wherein a seed layer 21, laminated reference layer 30, tunnel barrier layer 25, free layer 26 and capping layer 27 are sequentially formed on a substrate 20. The substrate may be a bottom electrode in a STT-MRAM, a bottom shield in a magnetic recording head, or a main pole layer in a MAMR scheme, for example. The seed layer is advantageously employed to promote smooth overlying layers and enhance PMA in overlying magnetic sub-layers within the reference layer. A preferred seed layer is a composite with a Ta/Mg/NiCr or TaN/Mg/NiCr configuration although other seed layer materials used in the art are acceptable. For example, the seed layer 21 may be a composite such Ta/M1/M2 where M1 is a metal having a fcc(111) or (hcp) hexagonal closed packed (001) crystal orientation such as Ru, and M2 is Cu, Ti, Pd, Pt, W, Rh, Au, or Ag. In another embodiment, the seed layer may have a TaN/Mg/NiFeCr, Ta/NiCr, Ta/NiFeCr, or Ta/Mg/NiFeCr configuration wherein NiCr and NiFeCr are considered growth enhancement layers. However, other seed layer materials may be selected that also promote a (111) crystal orientation in an overlying laminated reference layer.

A key feature of the first embodiment is a laminated reference layer 30 that is formed on a top surface of the seed layer 21, and preferably on a NiCr layer. In one aspect, the laminated reference layer has a $(Co/Ru)_x/Co$, $(Co/Rh)_x/Co$, or $(Co/Ir)_x/Co$ configuration where the number of laminates "x" is between 1 and 15. In other words, there are "x+1" magnetic sub-layers made of Co and "x" non-magnetic spacers that are laid down in alternating fashion such that the bottom layer and uppermost layer in the reference layer stack are Co. In an alternative embodiment, V, Mo, or Os may be selected as the non-magnetic spacer in place of Ru, Rh, or Ir. In another embodiment, one or more of the Co layers in the laminated reference layer 30 may be replaced by a Co rich CoFe alloy or with a CoM alloy wherein M is one of Ta, Ti, Mg, W, Ru, Rh, Hf, Zr, B, or Nb with a M content less than 5 atomic %. Each of the magnetic sub-layers preferably has a thickness from 4 to 15 Angstroms to enable sufficient PMA for spintronic applications, and to enhance the antiferromagnetic (AF) coupling between adjacent magnetic sub-layers. The thickness of the non-magnetic spacer is dependent on the element selected. For Ru, the thickness is preferably 4 Angstroms to establish antiferromagnetic (AF) coupling between neighboring Co layers. However, the Ru spacers may have a thickness of 9 or 14 Angstroms and still provide the desired AF coupling between adjacent magnetic sub-layers. In the case of Rh, a 1.5 Angstrom or 3 Angstrom thickness is employed to achieve optimum AF coupling. Thus, the dipolar field generated by each magnetic sub-layer is essentially cancelled by an adjacent sub-layer because of the AF coupling configuration.

As mentioned previously, one or more of the Co magnetic sub-layers may be replaced by a Co rich CoFe alloy where the Co content is greater than 50 atomic %. For example, the laminated reference layer 30 may have a $(Co/Ru)_x/CoFe$ configuration wherein the uppermost layer is CoFe and contacts the tunnel barrier layer 25. In yet another embodiment, the uppermost magnetic layer in the laminated reference layer stack is a composite such as CoFeB/Co or CoFe/Co.

In the exemplary embodiment, x=3 which means there are a total of four magnetic sub-layers 22a-22d and three non-magnetic spacers 23a, 23b, 23c that are arranged in alternating fashion. However, the laminated reference layer structure where x=3 is not necessarily the most preferred embodiment and is used here only for illustrative purposes. Thus, a first magnetic sub-layer 22a with a magnetic moment m1 contacts a top surface of the seed layer 21 and is separated from an overlying second magnetic sub-layer 22b having a magnetic moment m2 by a first non-magnetic spacer 23a. A second non-magnetic spacer 23b separates magnetic sub-layers 22b and 22c while a third non-magnetic spacer 23c separates magnetic sub-layers 22c and 22d. Note that m1 is aligned opposite to m2 and the magnetic moment m3 of the third magnetic sub-layer is opposite to m4 of the fourth magnetic sub-layer 22d. Therefore, the net moment for the laminated reference stack is essentially zero when each of the magnetic sub-layers has the same thickness and composition such that the magnitude of m1, m2, m3, and m4 are essentially equivalent.

In the most general embodiment, there is at least a first non-magnetic spacer 23a separating first and second magnetic sub-layers 22a, 22b, respectively. Of course, there is a plurality of alternative embodiments where an equal number of additional non-magnetic spacers and magnetic sub-layers are added in alternating fashion to a top surface of layer 22b. The total number of magnetic sub-layers included in the laminated reference layer 30 may be modified to adjust PMA, MR ratio, Hc, and other magnetic properties as desired for optimum MTJ performance. However, as x increases, the thickness of each magnetic sub-layer may be decreased to keep a substantially constant reference layer thickness and prevent MTJ thickness from becoming undesirably large.

The tunnel barrier layer 25 is comprised of one or more of MgO, AlOx, TiOx, ZnOx, or other metal oxides. Alloy oxides including but not limited to MgZnOx and AlTiOx may also be employed. A MgO tunnel barrier layer may be fabricated by depositing a first Mg layer on the uppermost magnetic sub-layer in the laminated reference layer 30, and then performing one or both of a natural oxidation (NOX) or radical oxidation (ROX) process, and finally depositing a second Mg layer on the oxidized first Mg layer. During a subsequent annealing process, the second Mg layer is oxidized to afford a substantially uniform MgO layer.

The free layer 26 may be a thin CoFeB or CoFeNiB layer wherein PMA is induced through an interface with the tunnel barrier layer. Furthermore, a PMA enhancing layer (not shown) such as MgO or another metal oxide may be inserted between the free layer 26 and capping layer 27 to further enhance PMA in the free layer through a second interface. Optionally, the capping layer may be comprised of a metal oxide. The present disclosure also anticipates the free layer may have a SAF structure comprised of two ferromagnetic layers separated by a non-magnetic antiferromagnetic coupling layer such as CoFeB/Ru/CoFe. In another embodiment, a material with intrinsic PMA such as an L10 ordered alloy of the form MT wherein M is Rh, Pd, Pt, Ir, or an alloy thereof, and T is Fe, Co, Ni or alloy thereof may be employed as the free layer. In yet another embodiment, the free layer may be a laminate of the form $(A1/A2)_n$, where the lamination number "n" is less than 6, A1 is one of Co, CoFe, or an alloy thereof, and A2 is one of Pt, Pd, Rh, Ru, Ir, Mg, Mo, Os, Si, V, Ni, NiCo, and NiFe, or A1 is Fe and A2 is V.

Preferably, the capping layer 27 is a material that enhances PMA in the free layer. Examples of capping layers are Ru/Ta, Ta/Ru, and Ru/Ta/Ru. Furthermore, metal oxides including MgO may be employed as a capping layer. In an embodiment wherein MgO serves both as the tunnel barrier and capping layer, the MgO oxide capping layer thickness is minimized or the oxidation state in the capping layer may be reduced to a certain extent to avoid a large increase in resistance×area (RA) value for the MTJ element.

Figure 4:
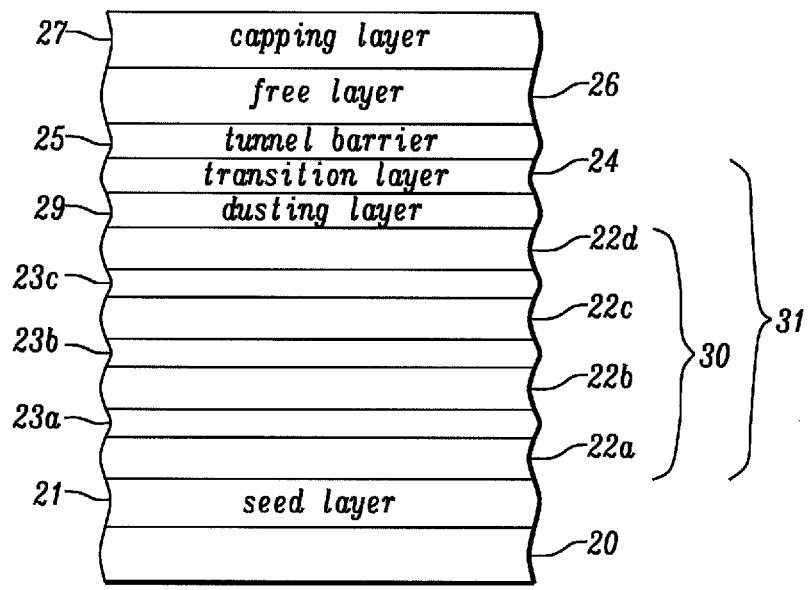
FIG. 4 is a cross-sectional view of the MTJ in FIG. 3 further comprised of a dusting layer and transition layer formed between the laminated reference layer and tunnel barrier according to a second embodiment of the present disclosure.

Referring to FIG. 4, a second embodiment is depicted that retains all of the features in the first embodiment. Furthermore, a dusting layer such as Ta and a transition layer that may be CoFeB, or CoFeB/Co are inserted between the laminated structure 30 and tunnel barrier 25. In other words, a modified reference layer 31 is formed where a thin Ta layer 29 about 1.5 Angstroms thick contacts a top surface of the uppermost magnetic sub-layer in laminated structure 30 and the transition layer 24 contacts a bottom surface of the tunnel barrier layer. The transition layer is ferromagnetically coupled to the uppermost layer 22d in the reference layer stack. The advantage of the second embodiment is that a higher MR ratio is achieved because of the CoFeB layer formed adjacent to the tunnel barrier layer. On the other hand, a higher dipole field is exerted on the free layer than in the first embodiment because the two magnetic layers 22d, 24 formed closest to the free layer are ferromagnetically coupled. Preferably, an amorphous CoFeB transition layer crystallizes to a bcc structure during post-deposition annealing thereby increasing TMR (MR ratio) especially when adjoining a (100) MgO tunnel barrier layer. A CoFeB layer thickness is selected between 6 and 14 Angstroms that is a compromise between a thick layer for higher MR ratio and a thin layer that enables a larger PMA in the CoFeB layer, and provides high coercivity such that reference layer Hc>free layer Hc. As a result, a combination of high coercivity and PMA are provided by reference layer 31. The thin dusting layer is responsible for good electrical properties and contributes to a high MR ratio.

Figure 5:
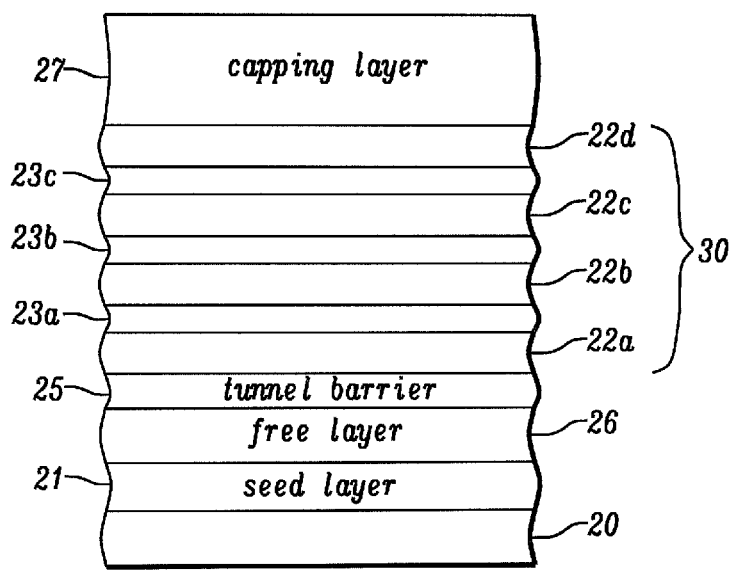
FIG. 5 is cross-sectional view of a MTJ with a top spin valve configuration wherein the laminated reference layer has magnetic sub-layers separated by non-magnetic spacers according to a third embodiment of the present disclosure.

In FIG. 5, a third embodiment of the present disclosure is shown wherein the laminated reference layer structure described previously is used in a MTJ with a top spin valve configuration. All of the layers are retained from FIG. 3 except the positions of the free layer 26 and laminated reference layer 30 are switched. In the top spin valve embodiment, seed layer 21, free layer 26, tunnel barrier 25, laminated reference layer 30, and capping layer 27 are sequentially formed on substrate 20.

Figure 6:
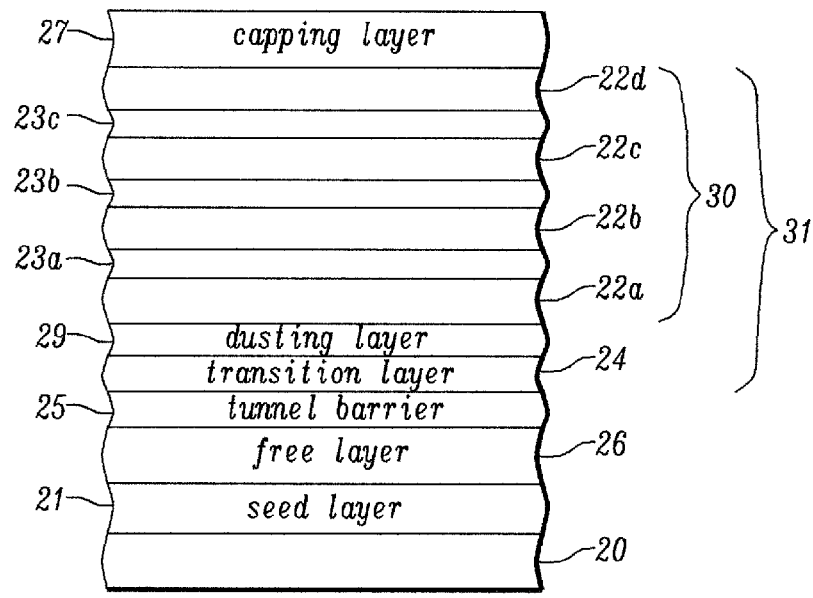
FIG. 6 is a cross-sectional view of the MTJ in FIG. 5 further comprised of a transition layer and dusting layer formed between the tunnel barrier and laminated reference layer according to a fourth embodiment of the present disclosure.

In a fourth embodiment that is illustrated in FIG. 6, the top spin valve design in FIG. 5 is modified to include a CoFeB or Co/CoFeB transition layer 24 contacting a top surface of the tunnel barrier, and a Ta dusting layer 29 between the transition layer and a bottom magnetic sub-layer 22a in the laminated reference layer stack 30. In this embodiment, the Ta dusting layer may also serve as a seed layer to promote smooth layers in the overlying reference layer.

All of the layers in the MTJ stacks may formed in a sputter deposition system such as an Anelva C-7100 thin film sputtering system or the like which typically includes physical vapor deposition (PVD) chambers, an oxidation chamber, and a sputter etching chamber. Typically, the sputter deposition process involves an argon sputter gas with ultra-high vacuum and the targets are made of metal or alloys to be deposited on a substrate. All of the MTJ layers may be formed after a single pump down of the sputter system to enhance throughput.

After all layers in the MTJ stack are laid down, the stack may be annealed at a temperature between 300° C. and 400° C. for a period of 2 minutes to 1 hour. No applied magnetic field is necessary during the annealing step because PMA is induced in the magnetic sub-layers through interfaces with adjoining non-magnetic spacers. Moreover, PMA is enhanced in the magnetic sub-layers due to the (111) texture in the composite seed layer 21 in the first two embodiments.

Thereafter, a conventional photoresist patterning and etching sequence is employed to form a plurality of MTJ elements in arrays of rows and columns. Subsequently, an insulation layer is deposited to fill the resulting gaps between adjacent MTJ elements. The insulation layer is typically planarized by a chemical mechanical polish (CMP) process to have a top surface that is coplanar with that of the capping layer. In a following step, a top electrode (array of conducting lines) is formed on the insulation layer and contacts the capping layer in the MTJ elements. The aforementioned processing steps are well known and are not described in detail herein.

EXAMPLE 1

To demonstrate the viability of the present disclosure, full field test structures were fabricated on a Si wafer. A first structure was prepared with the following configuration where the number after each layer indicates the thickness of the layer: Si/Si oxide/Ta50/Mg7/NiCr50/[Co8.5/Ru4]$_{10}$/Ta20/Ru50. In this example, Si/silicon oxide is the substrate, Ta/Mg/NiCr is the composite seed layer and Ta/Ru serves as a capping layer. A tunnel barrier layer and free layer are not included here since the purpose of the experiment is to show that the laminated (Co/Ru)$_x$ stack where x=10 exhibits antiferromagnetic coupling behavior. The stack of layers in the test configuration was annealed at 400° C. for 30 minutes.

Figure 7:
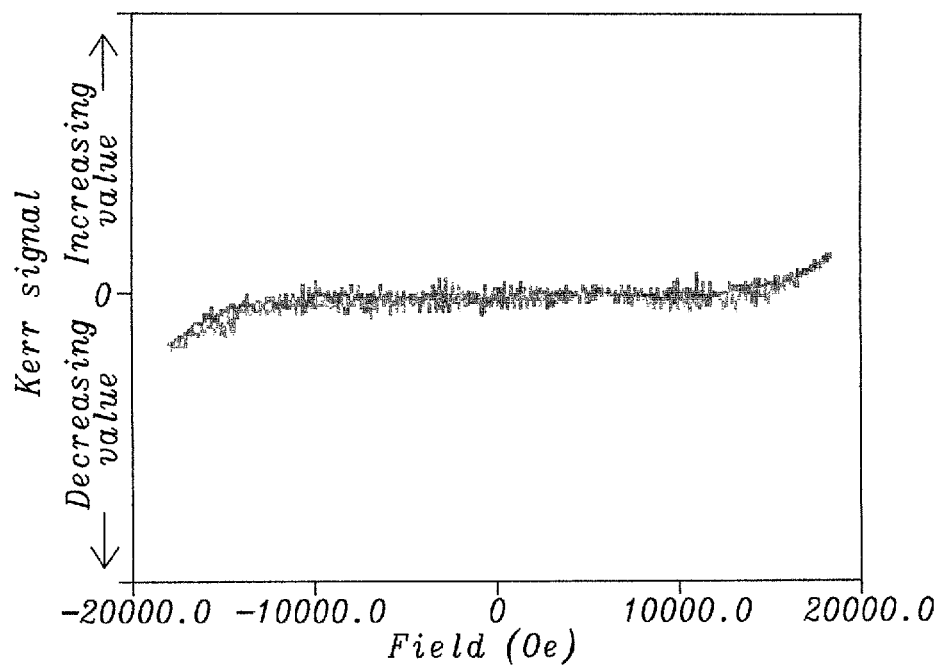
FIG. 7 is a plot of Kerr signal vs. magnetic field for a laminated reference layer having no net moment in a perpendicular to plane direction.

A magneto-optical Kerr measurement shown in FIG. 7 is performed under perpendicular fields. The horizontal axis on the plot is the field (H) that is applied perpendicular to the plane of the layers at a magnitude ranging from about −18000 Oe to +18000 Oe. The vertical axis value (rotation angle) is proportional to the net moment in the perpendicular to plane direction in the first test structure. No net moment is observed up to a ±15000 Oe field at which point the magnetization of individual sub-layers begins to "scissor" or switch direction. Thus, the horizontal region of the curve in FIG. 7 represents a condition where the synthetic antiferromagnet is fully compensated.

Figure 8:
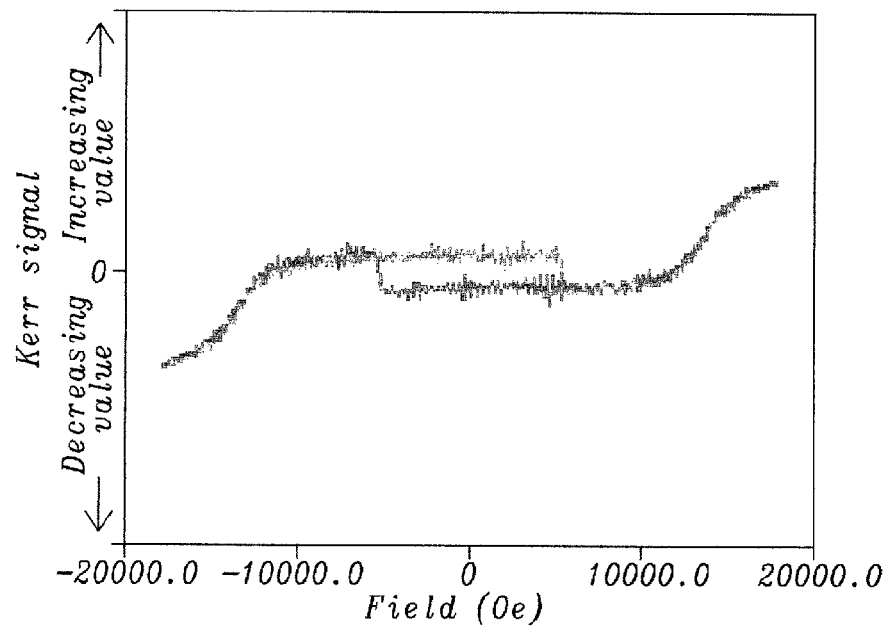
FIG. 8 is a plot of Kerr signal vs. magnetic field for a laminated reference layer with a net moment in a perpendicular to plane direction.

A second test structure was fabricated with the same configuration as the first structure except the thickness of each of the Co layers in the laminated (Co/Ru)$_{10}$ reference layer is increased to 11 Angstroms. Thicknesses of the other layers and the annealing step remain the same as described above. As illustrated in FIG. 8, the resulting Kerr measurement on the second structure shows a small net moment at zero field which means the synthetic antiferromagnet is not as completely compensated as in the prior example. Furthermore, the field at which the "scissoring" starts is decreased to around ±10000 Oe. The spin flopping where the magnetization flips over to opposite sign, and approximately zero net magnetization indicate each sub-layer has a magnetic moment that is anti-parallel to that of its closest magnetic sub-layer. Experimental data described herein confirms that a laminated reference layer comprised of (Co/Ru)x or the like will exert a substantially reduced or negligible Ho field on a free layer in a MTJ structure. In addition, a strong PMA character is realized in the laminated film.

EXAMPLE 2

A third test structure was built to incorporate a laminated reference layer of the present disclosure into a MTJ. This example demonstrates compatibility of the laminated reference layer stack with a MTJ design, and provides actual results for a MTJ stack that is patterned into circular bits with a diameter between 60 nm and 120 nm. The MTJ configuration is represented by the following: TaN20/Mg7/NiCr50/ [Co6/Rh1.5]$_{10}$/Co6/Ta1.5/Co$_{20}$Fe$_{60}$B$_{20}$8/MgO/ Co$_{20}$Fe$_{50}$B$_{30}$17/MgO. In this example, TaN/Mg/NiCr is a composite seed layer, (Co/Rh)$_{10}$/Co is the laminated reference layer, Ta is a dusting layer, and CoFeB is a transition layer formed according to a second embodiment of the present disclosure. A second CoFeB layer serves as the free layer and a second MgO layer is used as a capping layer. The two MgO layers have a combined thickness between 10 and 15 Angstroms.

The CoFeB composition in the transition layer is set at Co$_{20}$Fe$_{60}$B$_{20}$. It should be understood that as the Fe content is increased to Co$_{10}$Fe$_{70}$B$_{20}$, for example, the Mst contribution from the CoFeB layer will increase for a given thickness. Furthermore, Hc and Ho will increase as the Fe content becomes larger. On the other hand, as B content becomes greater by replacing a Co$_{20}$Fe$_{60}$B$_{20}$ layer with a Co$_{20}$Fe$_{50}$B$_{30}$ layer, for example, the Mst contribution from the CoFeB layer will decrease, and Hc and Ho will decrease as well. Therefore, additional flexibility in adjusting Ho is realized by modifying the CoFeB composition in the transition layer portion of the composite reference layer. Preferably, the Fe content in the CoFeB layer is greater than 20 atomic % and the B content is from 10 to 40 atomic %.

Figure 9:
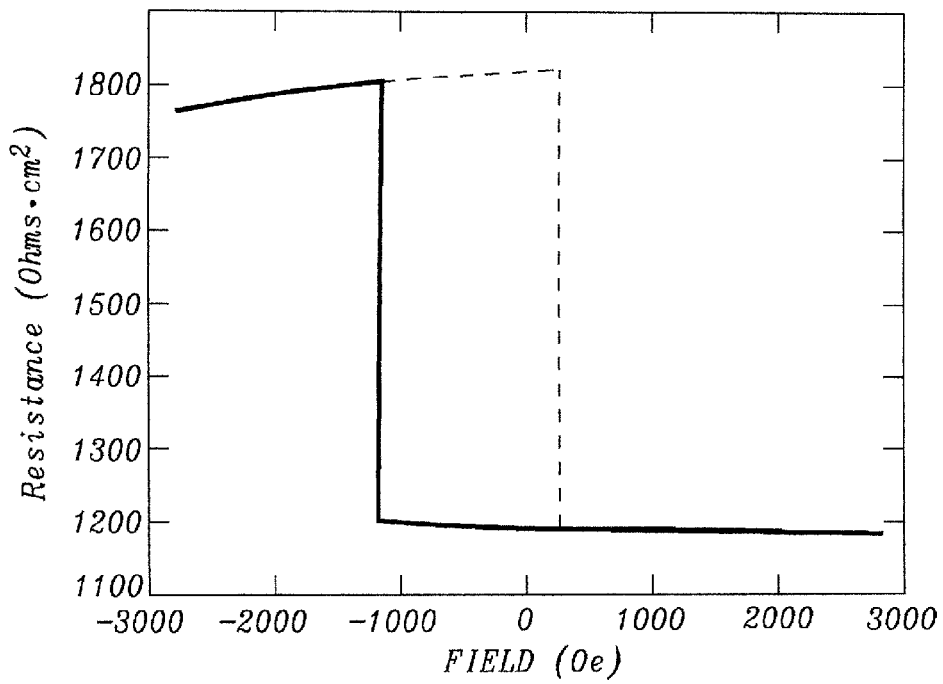
FIG. 9 is a plot of applied field vs. net moment in perpendicular to plane direction for a MTJ having a laminated reference layer formed according to a bottom spin valve embodiment of the present disclosure.

In FIG. 9, magneto-resistance measurements under perpendicular fields of a 70 nm circular MTJ device having the third test structure configuration are illustrated. Again, the vertical axis value is proportional to the net moment in the perpendicular to plane direction and is shown in units of resistance (ohms-cm$^2$). The switching observed is that of the free layer since the laminated reference layer does not switch in the range of the −3000 to +3000 Oe applied field. We unexpectedly find that high magneto-resistance (high MR ratio of 60%) is realized when the laminated reference layer disclosed herein is included in a MTJ element, and that the loop shift of the MTJ device is small. The Ho field exerted on the free layer is 200 Oe.

Each magnetic sub-layer has a thickness that is reduced compared with conventional ferromagnetic layers in order to increase the coupling field between adjacent sub-magnetic layers and reduce the dipolar field of the individual magnetic layers. It is believed that a magnetic sub-layer thickness less than about 15 Angstroms is required for in-plane magnetization to be overcome by perpendicular magnetic anisotropy, and a thickness of at least 4 Angstroms is needed to provide a uniform layer. Moreover, the antiferromagnetic coupling between adjacent magnetic sub-layers further minimizes the dipole field exerted on the free layer. A reduced dipole field also allows a greater packing density of MTJ devices in a STT-MRAM array since the dipole field in a first MTJ will have a substantially smaller influence on a free layer in a neighboring MTJ than in a conventional structure with neighboring MTJs. As mentioned earlier, the smaller dipole field in each MTJ will enable a higher thermal stability that results in a significant improvement in STT-MRAM performance or in other spintronic devices based on a magnetic tunnel junction element. In other words, the fully compensated synthetic antiferromagnets as disclosed herein will allow processing at temperatures to at least 400° C. without any degradation in magnetic properties.

While this disclosure has been particularly shown and described with reference to, the preferred embodiment thereof, it will be understood by those skilled in the art that various changes in form and details may be made without departing from the spirit and scope of this disclosure.

We claim:

1. A magnetic tunnel junction (MTJ) element, comprising:
   (1) a seed layer that is one of Ta/Mg/NiCr, TaN/Mg/NiCr, TaN/Mg/NiFeCr, Ta/NiCr, Ta/NiFeCr, or Ta/Mg/NiFeCr, or has a Ta/M1/M2 configuration where M1 is Ru, and M2 is one of Cu, Ti, Pd, Pt, W, Rh, Au, or Ag; and
   (2) a synthetic antiferromagnet formed on the seed layer, comprising:
      (a) a plurality of "x+1" magnetic sub-layers having perpendicular magnetic anisotropy (PMA) and made of Co or CoM where M is one of Ta, Ti, W, Mg, Ru, Rh, Hf, Zr, B, or Nb with a M content less than 5 atomic % and x is from about 1 to 15; and
      (b) "x" non-magnetic spacers that are formed in an alternating configuration with the "x+1" magnetic sub-layers to form a laminated stack of layers wherein a magnetic sub-layer is a bottom layer in the stack, a magnetic sub-layer is a top layer in the stack, and wherein each non-magnetic spacer has a top surface and a bottom surface that forms an interface with an adjoining magnetic sub-layer thereby establishing antiferromagnetic coupling between the adjoining magnetic sub-layers and inducing PMA in the adjoining magnetic sub-layers.

2. The MTJ element of claim 1 wherein the laminated stack of layers is a reference layer, and the MTJ element is further comprised of a tunnel barrier layer, free layer, and capping layer that are sequentially formed on the reference layer.

3. The MTJ element of claim 2 further comprised of a Ta dusting layer that contacts a top surface of the top magnetic sub-layer in the laminated stack, and a transition layer that is CoFeB or CoFeB/Co formed on the Ta dusting layer and which contacts a bottom surface of the tunnel barrier layer.

4. The MTJ element of claim 3 wherein the tunnel barrier layer is a metal oxide.

5. The MTJ element of claim 1 wherein each of the magnetic sub-layers has a thickness between about 4 and 15 Angstroms.

6. The MTJ element of claim 1 wherein the non-magnetic spacers are comprised of Ru, Rh, Ir, V, Mo, or Os.

7. A magnetic tunnel junction (MTJ) element, comprising:
   (a) a seed layer formed on a substrate;
   (b) a laminated reference layer wherein a plurality of "x+1" magnetic sub-layers made of Co are formed in a stack with a bottom magnetic sub-layer contacting the seed layer and a top magnetic sub-layer contacting an overlying tunnel barrier layer, and "x" non-magnetic spacers each having a top surface and a bottom surface that form an interface with an adjoining magnetic sub-layer thereby establishing antiferromagnetic coupling between the adjoining magnetic sub-layers and inducing PMA in the adjoining magnetic sub-layers;
   (c) the tunnel barrier layer;
   (d) a free layer formed on the tunnel barrier layer; and
   (e) a capping layer as the upper most layer in the MTJ element.

8. The MTJ element of claim 7 wherein the seed layer is a composite that has a Ta/Mg/NiCr or TaN/Mg/NiCr configuration.

9. The MTJ element of claim 7 further comprised of a Ta dusting layer that contacts the top magnetic sub-layer in the laminated reference layer.

10. The MTJ element of claim 9 further comprised of a transition layer formed on a top surface of the Ta dusting layer, the transition layer includes a CoFeB layer with a thickness between about 6 and 14 Angstroms.

11. The MTJ element of claim 7 wherein "x" is from about 1 to 15 and each of the Co layers has a thickness between about 4 and 15 Angstroms.

12. The MTJ element of claim 7 wherein the non-magnetic spacers are made of Ru, Rh, Ir, V, Mo, or Os.

13. The MTJ element of claim 12 wherein a Ru non-magnetic spacer has a thickness of about 4 or 9 Angstroms, and a Rh non-magnetic spacer has a thickness of about 1.5 or 3 Angstroms to establish antiferromagnetic coupling between adjoining magnetic sub-layers.

14. A method of fabricating a laminated structure that is a synthetic antiferromagnet in a magnetic tunnel junction (MTJ) stack of layers, comprising:
  (a) providing a seed layer on a substrate; and
  (b) depositing a laminated stack including a plurality of "x+1" magnetic sub-layers made of Co and "x" non-magnetic spacers in an alternating configuration such that a bottom magnetic sub-layer contacts a top surface of the seed layer and a top magnetic sub-layer is the uppermost layer in the laminated stack, and wherein each non-magnetic spacer has a top surface and a bottom surface that form an interface with an adjoining magnetic sub-layer thereby establishing antiferromagnetic coupling between the adjoining magnetic sub-layers and inducing PMA in the adjoining magnetic sub-layers.

15. The method of claim 14 wherein the seed layer has a TaN/Mg/NiCr or Ta/Mg/NiCr configuration.

16. The method of claim 14 wherein "x" is from about 1 to 15 and each of the Co layers has a thickness between about 4 and 15 Angstroms.

17. The method of claim 14 wherein the non-magnetic spacers are made of Ru, Rh, Ir, V, Mo, or Os.

18. The method of claim 14 further comprised of sequentially forming a tunnel barrier layer, a free layer, and a capping layer on the uppermost magnetic sub-layer in the laminated stack.

19. The method of claim 14 further comprised of depositing a Ta dusting layer on a top surface of the uppermost magnetic sub-layer, and a CoFeB or CoFeB/Co transition layer on the Ta dusting layer.

20. The method of claim 19 further comprised of sequentially forming a tunnel barrier layer, free layer, and capping layer on the transition layer.

21. The method of claim 14 further comprised of annealing the laminated stack in a temperature range of about 300° C. to 400° C. for a period for about 2 minutes to 1 hour.

22. The method of claim 14 wherein each non-magnetic spacer is Ru and has a thickness of about 4, 9, or 14 Angstroms.

23. The method of claim 14 wherein each non-magnetic spacer is Rh and has a thickness of about 1.5 or 3 Angstroms.

24. A magnetic tunnel junction (MTJ) element, comprising:
  (a) a seed layer formed on a substrate;
  (b) a free layer formed on the seed layer;
  (c) a tunnel barrier made of a metal oxide that is formed on the free layer;
  (d) a laminated reference layer wherein a plurality of "x+1" magnetic sub-layers made of Co are formed in a stack with a bottom magnetic sub-layer contacting the tunnel barrier layer and a top magnetic sub-layer contacting an overlying capping layer, and "x" non-magnetic spacers each having a top surface and a bottom surface that form an interface with an adjoining magnetic sub-layer thereby establishing antiferromagnetic coupling between the adjoining magnetic sub-layers and inducing PMA in the adjoining magnetic sub-layers; and
  (e) the capping layer as the upper most layer in the MTJ element.

25. The synthetic antiferromagnet of claim 24 wherein the MTJ element is further comprised of a CoFeB or CoFeB/Co transition layer that contacts a top surface of the tunnel barrier, and a Ta dusting layer that contacts the bottom magnetic sub-layer in the laminated stack of layers.

* * * * *